United States Patent
Von Thun et al.

(10) Patent No.: US 6,771,113 B1
(45) Date of Patent: Aug. 3, 2004

(54) FIVE VOLT TOLERANT AND FAIL SAFE INPUT SCHEME USING SOURCE FOLLOWER CONFIGURATION

(75) Inventors: Matthew S. Von Thun, Colorado Springs, CO (US); Brian E. Burdick, Colorado Springs, CO (US); Edson W. Porter, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/068,768

(22) Filed: Feb. 6, 2002

(51) Int. Cl.[7] .................................. H03K 17/687
(52) U.S. Cl. ...................... 327/437; 327/408; 326/68
(58) Field of Search .................. 332/437, 427, 332/108, 407, 408; 326/68, 27, 83; 327/520, 560, 437, 434

(56) References Cited

U.S. PATENT DOCUMENTS

| | | | | |
|---|---|---|---|---|
| 4,760,287 A | * | 7/1988 | Goto et al. .................... 327/77 |
| 5,218,247 A | * | 6/1993 | Ito et al. ....................... 307/475 |
| 5,712,556 A | * | 1/1998 | Okamura ...................... 327/539 |
| 5,942,921 A | * | 8/1999 | Talaga, Jr. .................... 327/77 |
| 6,225,855 B1 | * | 5/2001 | Taguchi ........................ 527/538 |
| 6,441,651 B2 | * | 8/2002 | Lien ............................. 327/78 |

FOREIGN PATENT DOCUMENTS

JP    411205048    *   7/1999

* cited by examiner

Primary Examiner—Dinh T. Le
(74) Attorney, Agent, or Firm—Christopher P. Maiorana PC

(57) ABSTRACT

An apparatus comprising a device and a resistor. The device generally comprises (i) a gate configured to receive an input voltage, (ii) a drain coupled to a first supply voltage, and (iii) a source coupled to an output. The resistive element is generally coupled between the source and a second supply voltage. The apparatus generally provides voltage tolerance between the input voltage and the output.

19 Claims, 9 Drawing Sheets

100

FIVE VOLT TOLERANT AND FAIL SAFE INPUT SCHEME USING SOURCE FOLLOWER CONFIGURATION

FIELD OF THE INVENTION

The present invention relates to a method and/or architecture for implementing voltage tolerance generally and, more particularly, to a voltage tolerant (e.g., 5v) fail-safe input scheme using a source follower configuration.

BACKGROUND OF THE INVENTION

In general a five volt tolerant circuit is a circuit that is able to withstand five volts on the input without compromising reliability while power is being supplied. A five volt fail-safe circuit is a circuit that is able to withstand five volts on the input without compromising reliability while power is either being supplied to the circuit or not being supplied to the circuit.

In a standard CMOS process, NMOS devices are formed in a P-well which is inherently tied to a P type substrate. PMOS devices are formed in an N-well diffusion tub, which is isolated from the substrate and the wells of other PMOS devices. During normal operation, the N well diffusion is tied to VSS. However, to provide five volt fail safe protection, the well of the PMOS device is disconnected from VDD and tied to the PAD voltage whenever the pad rises above VDD. This will prevent the gate to well potential from ever exceeding VDD, even in a power down condition.

It would be desirable to implement a five volt tolerant and fail-safe input scheme using a source follower configuration.

SUMMARY OF THE INVENTION

The present invention concerns an apparatus comprising a device and a resistor (or active device biased to create a resistive element). The device generally comprises (i) a gate configured to receive an input voltage, (ii) a drain coupled to a first supply voltage, and (iii) a source coupled to an output. The resistive element is generally coupled between the source and a second supply voltage. The apparatus generally provides voltage tolerance between the input voltage and the output.

The objects, features, method and/or advantages of the present invention include implementing a circuit that may (i) provide voltage tolerance above a supply voltage (e.g., 5 volts), (ii) provide a fail-safe input scheme, (iii) implement a source follower configuration, and/or (v) be implemented with or without a native device.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
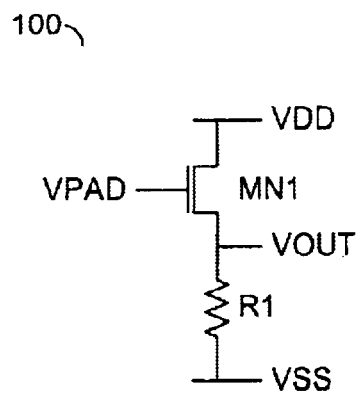
FIG. 1 is a diagram of an embodiment of the present invention.

Referring to FIG. 1, a diagram of a circuit 100 is shown in accordance with a preferred embodiment of the present invention. The circuit 100 is shown implementing an NMOS configuration. However, a PMOS configuration may also be implemented (to be described in more detail in connection with FIG. 7). The circuit 100 generally comprises a transistor MN1 and a resistor R1. A drain of the transistor MN1 is generally connected to a supply voltage (e.g., VDD). A source of the transistor MN1 is generally connected to an output node (e.g., Vout) and a first side of the resistor R1. A second side of the resistor R is generally connected to a second supply voltage (e.g., VSS). The voltage VSS may be a ground voltage or a virtual ground voltage. A gate of the transistor MN1 generally receives a pad voltage (e.g., Vpad). In one example, the resistor R1 may be implemented as an active device.

The transistor MN1 is generally configured in a source-follower arrangement with the resistive element R1 to provide voltage tolerance (e.g., five volt tolerance) and/or fail-safe (e.g., five volt) protection. Such configurations may be especially useful for low voltage differential input applications.

In the example illustrated in FIG. 1, the transistor MN1 is shown implemented as an NMOS transistor. The transistor MN1 is generally connected in a source follower configuration. The voltage Vpad can range, in one example, from 0V to 5V. The transistor MN1 is designed to limit the voltage to not exceed the supply voltage VDD (in one example 3.3v) across the gate oxide.

Figure 2:
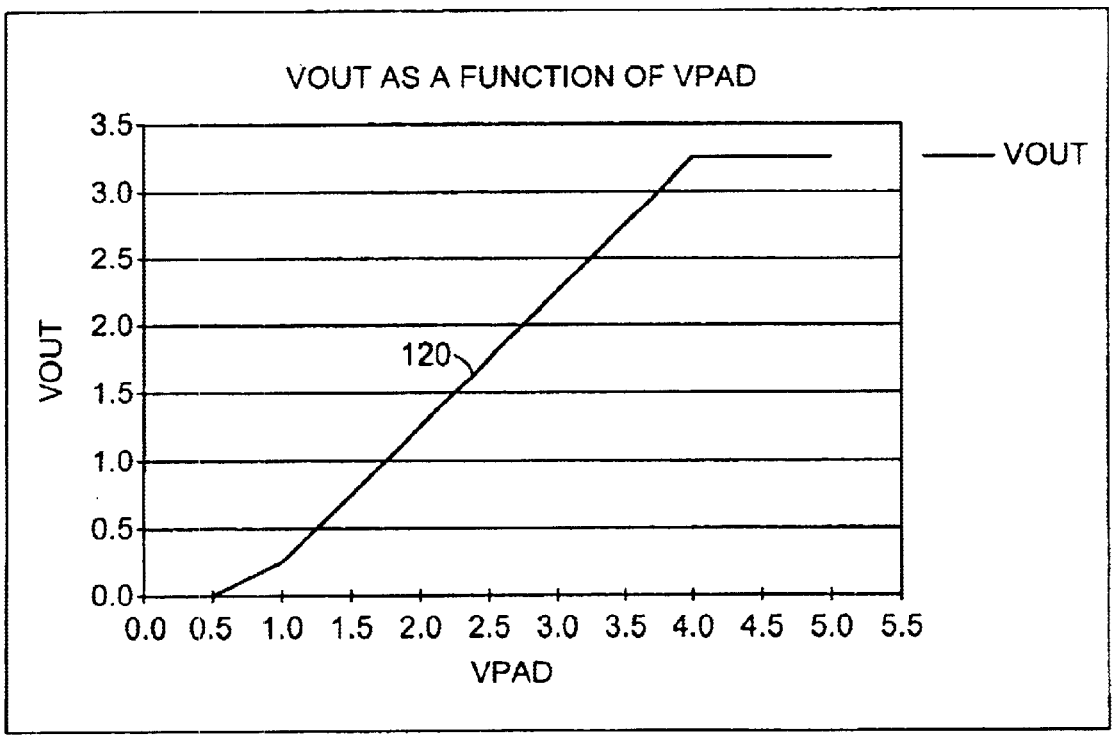
FIG. 2 is a graph illustrating the output voltage as a function of the pad voltage.

When the voltage Vpad equals the threshold voltage Vt of the NMOS device MN1, the transistor MN1 turns on and current flows through the resistor R1 (e.g., Ron). As current flows through the resistor R1, the output voltage Vout rises. The output voltage Vout is generally limited to the voltage Vpad—the threshold voltage Vt, since any voltage on the source greater than Vpad—Vt will shut off the NMOS device MN1. When the voltage Vpad reaches VDD+Vt, the NMOS device MN1 moves into a linear mode (e.g., slope 120 in FIG. 2), and the output voltage Vout is limited to the voltage VDD–(VDD* [Ron/(Ron+R1)]). Even though the gate of the NMOS device MN1 may reach voltages in excess of the supply voltage VDD and the bulk of the NMOS device MN1 is tied to the voltage VSS, the voltage across the gate oxide will not normally exceed the supply voltage VDD.

Figure 3:
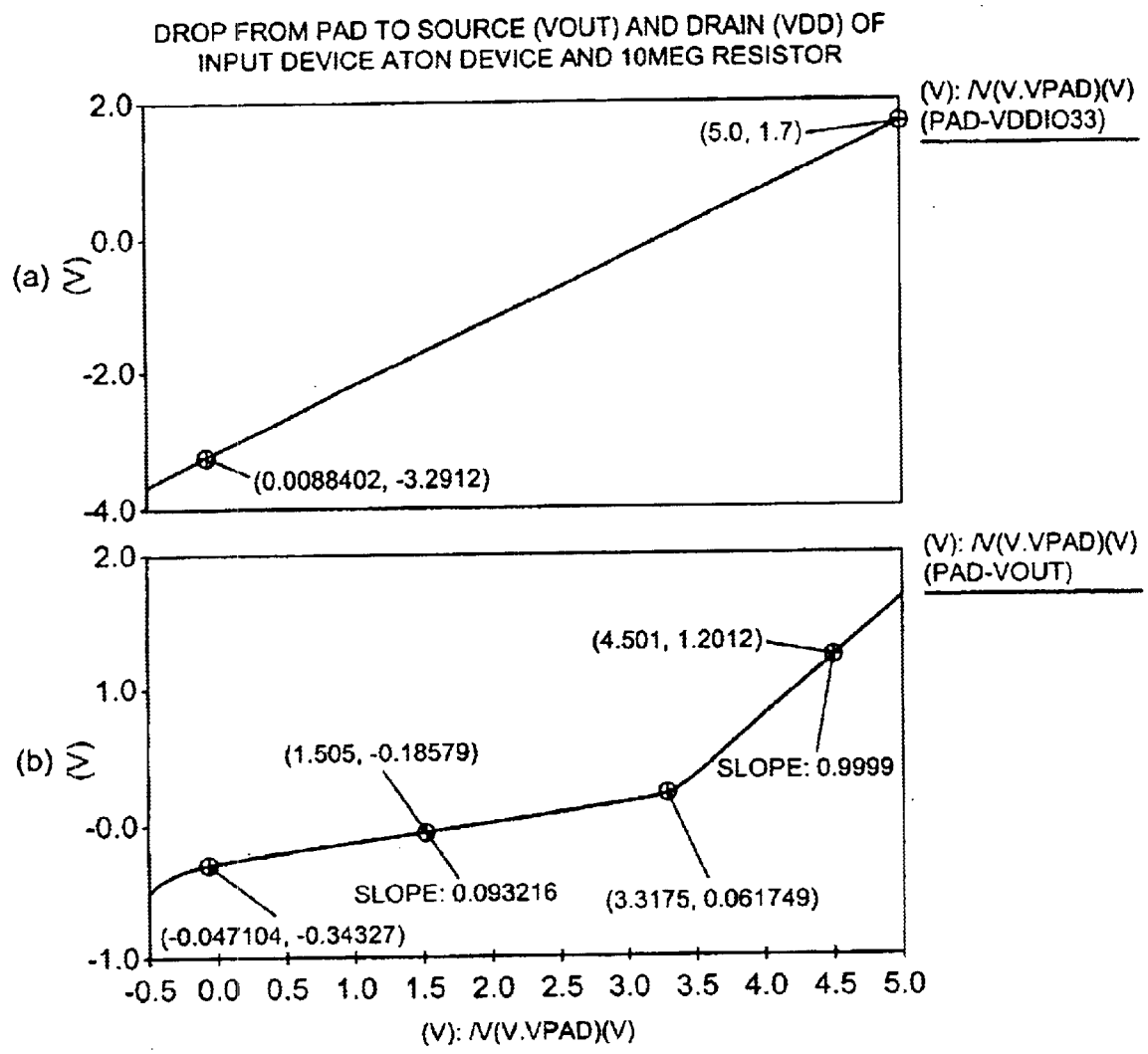
FIG. 3 is a graph illustrating the voltage drop from pad to source (and pad to drain) with exemplary values of resistance.

FIG. 3 is a graph illustrating the voltage drop from the pad to drain (3a) and pad to source (3b) with exemplary values of the resistance. FIG. 3a illustrates that as the pad voltage ramps from 0V to 5V, the drop across the gate and drain of the input device ranges from −Vdd (−3.65v in this case) to 1.7v. In FIG. 3b illustrates that as the pad voltage ramps from 0V to 5V, the voltage drop from the gate to the source of the input devices ranges from −0.5V to 1.7V. Therefore, at no time is a voltage of greater than VDD dropped across the gate oxide.

Figure 4:
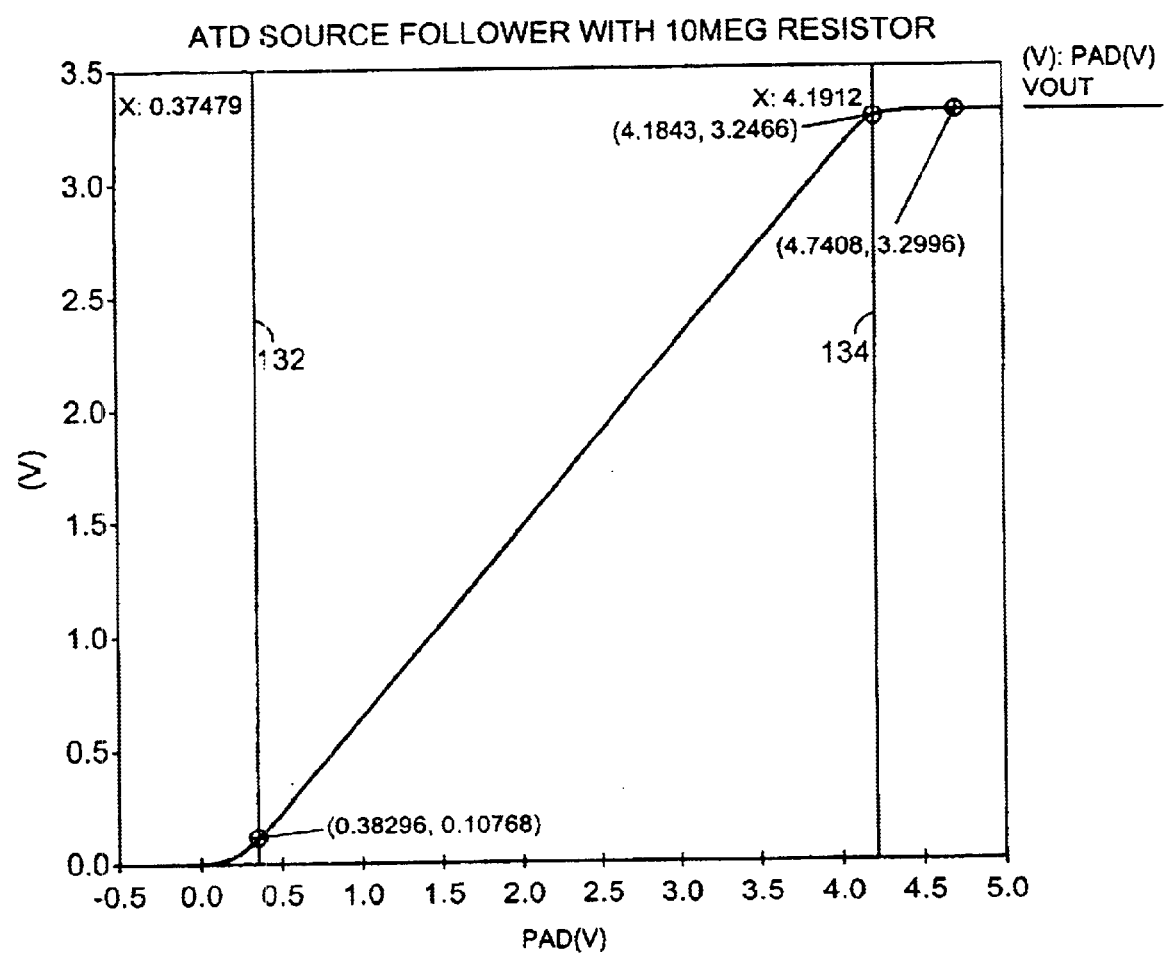
FIG. 4 is an illustration of the output voltage versus the pad voltage with a 10 MΩ resistor.

FIG. 4 is an illustration of the output voltage versus the pad voltage with a 10 MΩ resistor. The output voltage is shown ranging from 0v to around 3.3v. When x=0.37479 at the line 132, a linear voltage increase begins. The linear increase generally ends when x=4.1912 at the line 134.

Figure 5:
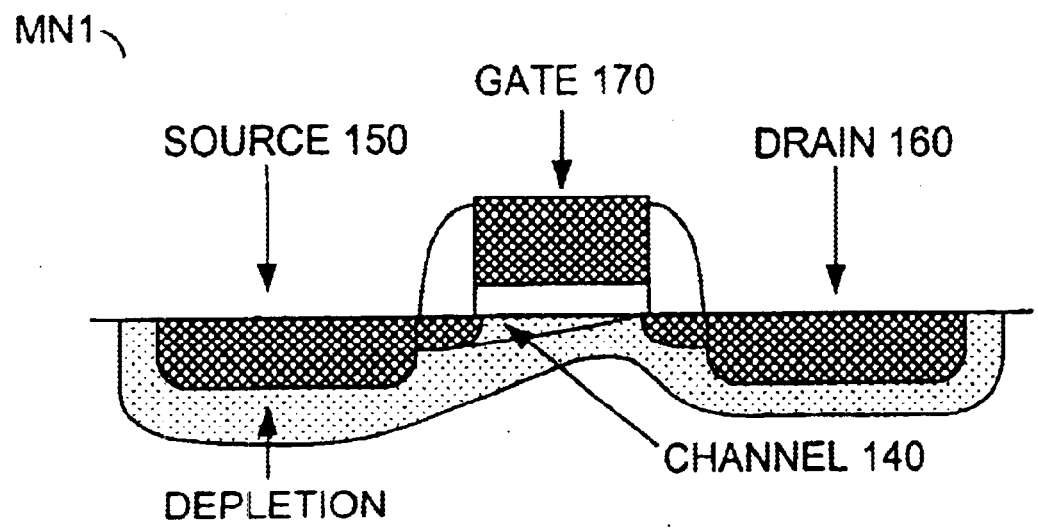
FIG. 5 is a cross section of the device of FIG. 1 illustrating a channel while in a first state.
Figure 6:
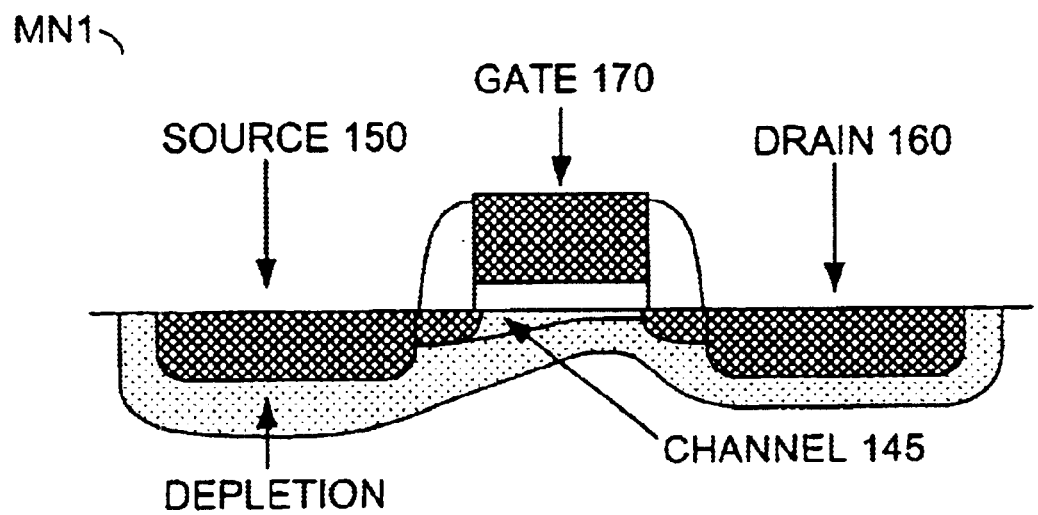
FIG. 6 is another cross section of the device of FIG. 1 illustrating a channel while in a second state.

Referring to FIG. 5 and FIG. 6, cross sections of the device MN1 are shown. When the gate to source voltage (e.g., Vgs) is less than the drain to source voltage (e.g., vds)+the threshold voltage Vt, a pinched off channel 140 forms between the source 150 and the drain 160. The voltage at the source 150 will generally be equal to the voltage of the gate 170 minus the threshold voltage Vt. The voltage at the drain 160 will generally be equal to the supply voltage VDD. Thus, the voltage at the base of the gate oxide will be graded from the supply voltage VDD to Vgs−Vt. Therefore, the oxide will never see a voltage greater than the supply voltage VDD.

When the gate 170 rises a threshold voltage Vt above the supply voltage VDD, a resistive channel (e.g., 145 of FIG. 6) forms. The voltage across the channel 145 is graded from the supply voltage VDD on the drain side and VDD−(VDD*[Ron/(Ron+R1)]) on the source side.

As long as the resistance R1 is large, the source remains close to the supply voltage VDD. Thus, if the maximum allowable supply voltage VDD is 3.3V, the input may be driven to 6.6V without oxide reliability concerns. Therefore, the circuit 100 limits the output voltage Vout to less than the supply voltage VDD. Limiting the output may (i) protect devices downstream of the output Vout and (ii) limit the voltage across the input NMOS device MN1 to less than VDD.

The circuit 100 may be implemented with a standard enhancement NMOS device. However, the circuit 100 can be modified by implementing the transistor MN1 as a native NMOS device. A native device is a device with a threshold voltage at or near 0 volts. While not all processes have native devices available, when a native device is available, a significant advantage over the standard NMOS device may result. In particular, the same discussion above applies to the NMOS native configuration. However, since the threshold voltage of the native device is at or near 0 volts, the output voltage Vout=Vpad, up to the point where the pad voltage Vpad=VDD. Thus, the voltage is passed cleanly through to the output voltage Vout without any level shifting (e.g., the output in FIG. 4 would reach 3.5 volts).

Figure 7:
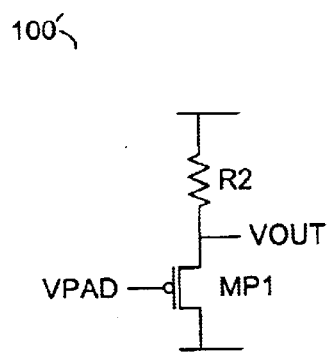
FIG. 7 is a diagram of an alternate embodiment of the present invention.

Referring to FIG. 7, a circuit 100' is shown implementing an alternate embodiment of the present invention. The circuit 100' generally implements a transistor MP1 in a configuration that is generally a complement to the NMOS configuration described in connection with FIG. 1.

Figure 8:
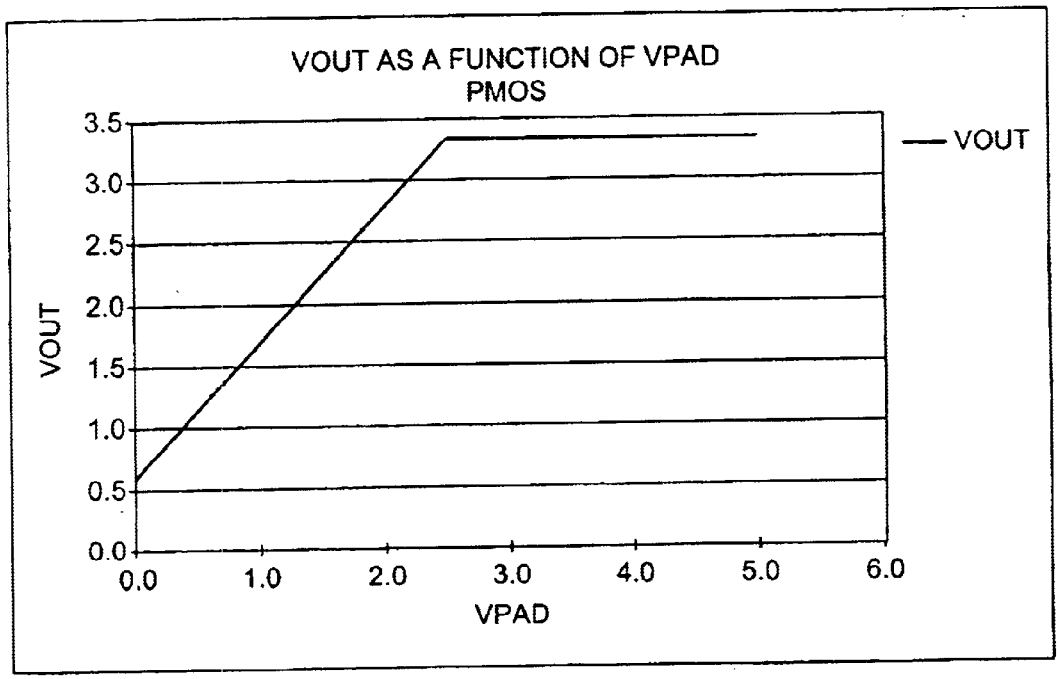
FIG. 8 is a graph of the output voltage as a function of the input voltage for a PMOS device.
Figure 9:
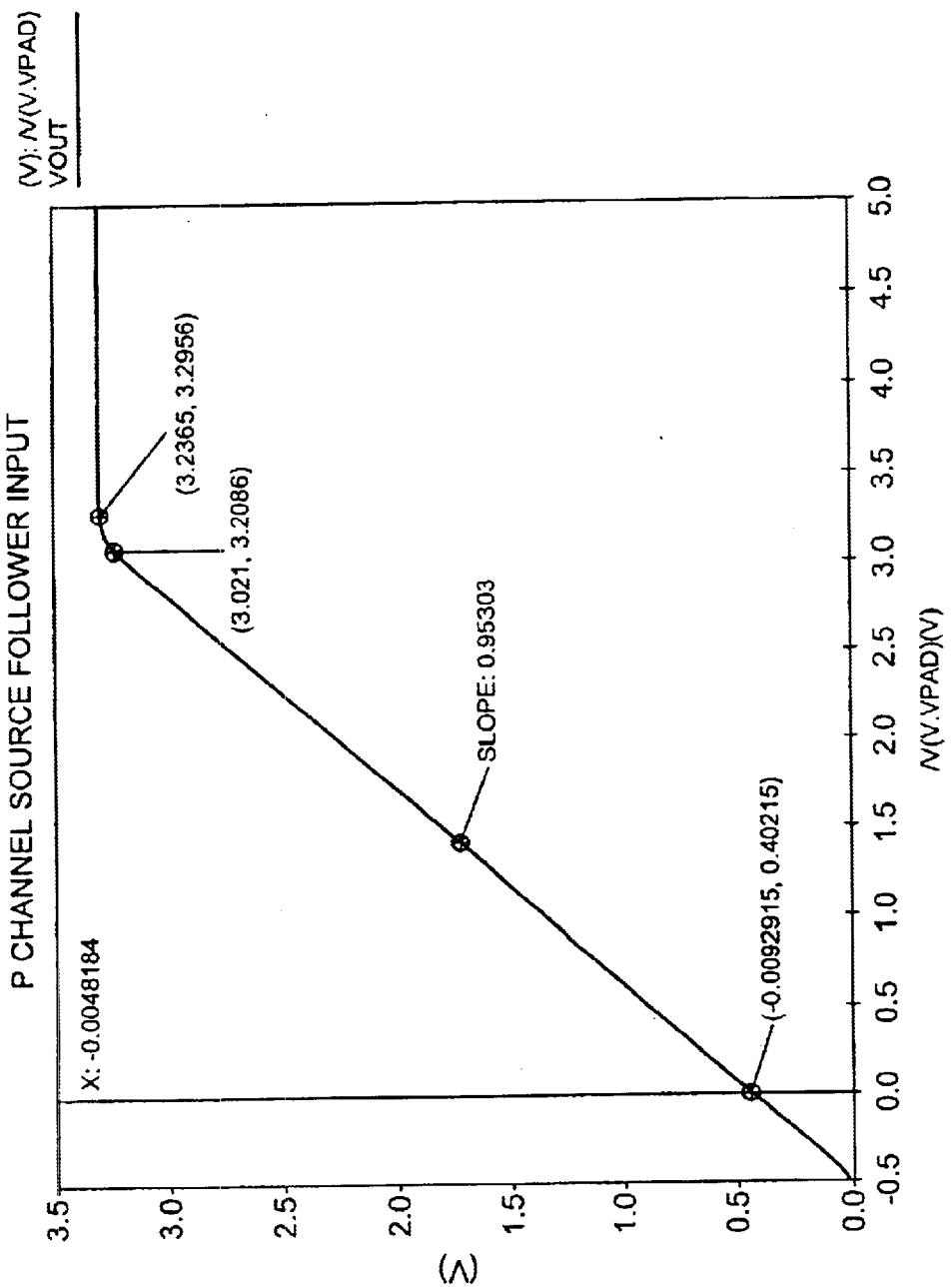
FIG. 9 is an illustration of the p-channel source follower implementation of FIG. 8.

When implementing a PMOS transistor MP1, when the voltage Vpad is 0 volts, the output voltage Vout is clamped at Vpad+Vt. As the pad voltage Vpad is ramped, the output voltage Vout continues to be Vpad+Vt until Vout reaches VDD−(VDD* [R1/(Ron+R2)]. This voltage will be approximately equal to the supply voltage VDD as long as the resistance Ron is large with respect to R2. Since the output voltage Vout is clamped at a voltage below the supply voltage VDD, no devices down stream will see input voltages greater than the supply voltage VDD even if the pad voltage Vpad rises to 5 volts. FIG. 8 illustrates the voltage output Vout as a function of the voltage Vpad for a PMOS device. FIG. 9 illustrates another graph of a p-channel source follower input.

The NMOS device can have a similar fail safe mode if a triple well structure is used. A triple well process architecture isolates the P type well of the NMOS device from the substrate by encapsulating it in an N type diffused region. Because both the P well and surrounding N type diffusion can be isolated from the substrate, the P type well can be floated in the same manner as previously described with the N Well of the PMOS device. This allows the NMOS device to be 5V fail safe.

Figure 10:
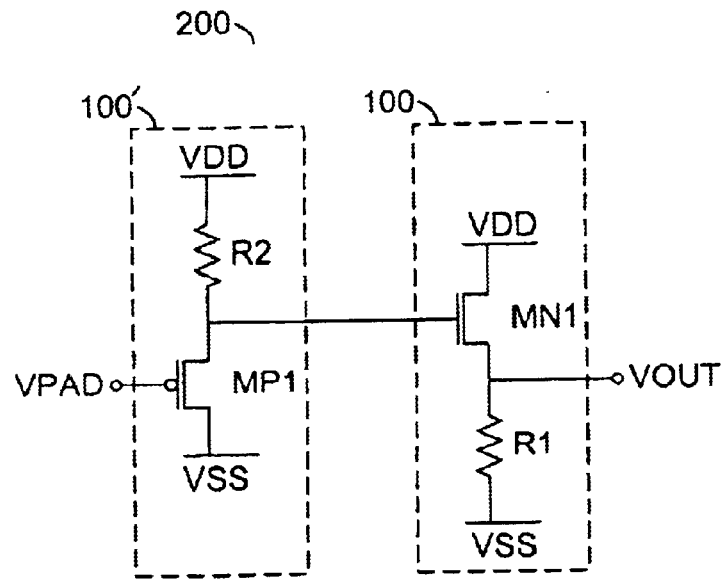
FIG. 10 is a diagram of an alternate embodiment of the present invention.
Figure 11:
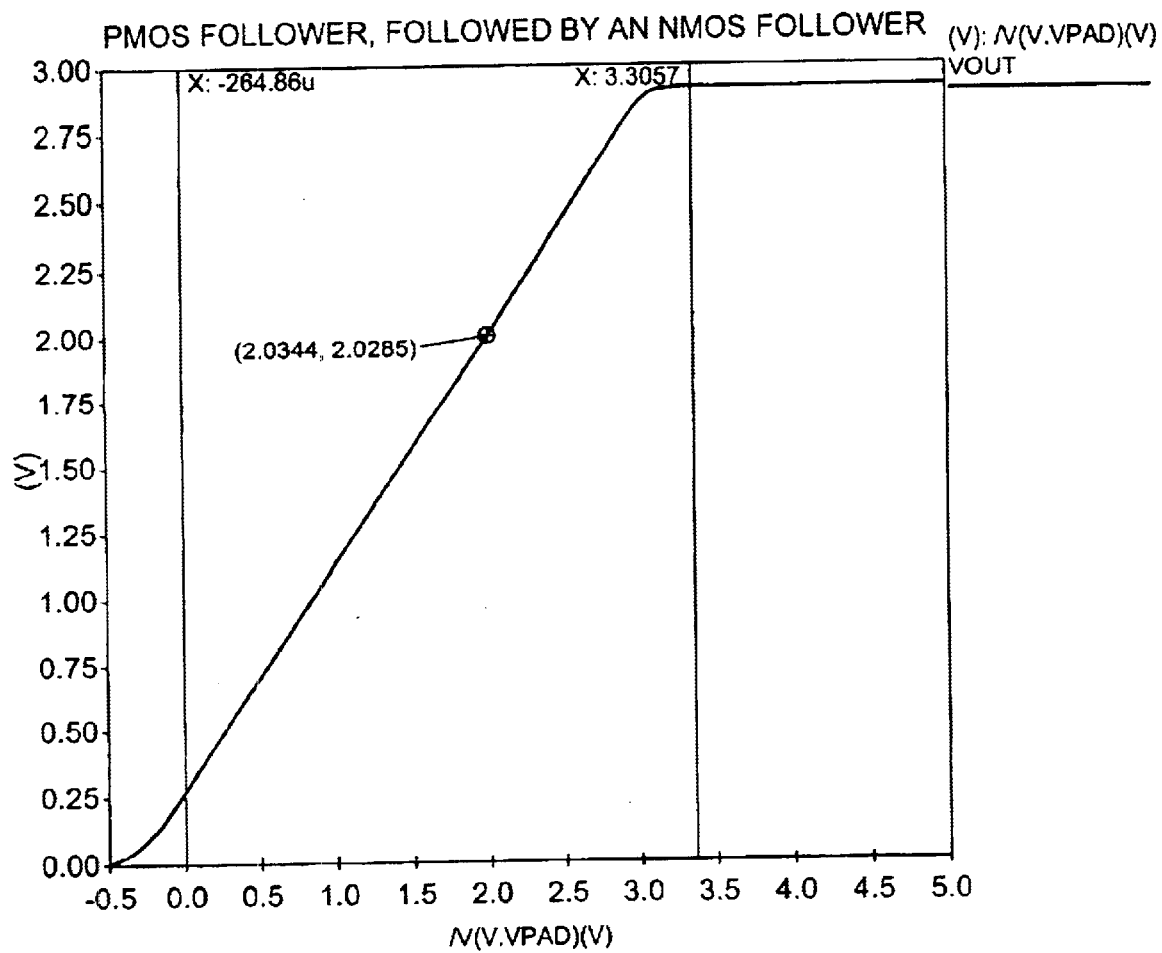
FIG. 11 is a graph of a PMOS follower followed by an NMOS follower.

The level shifting effect may be cancelled if a complementary configuration is implemented. For example, if the threshold voltages of the NMOS and PMOS devices are roughly the same, the level shift effect can be canceled out by running the output of a the PMOS configuration into the input of the NMOS configuration, or vise versa. FIG. 10 illustrates an example of the circuit 100' connected in series with the circuit 100 to provide such connection in level shifting. FIG. 11 illustrates a simulation of the voltage output Vout as a function of the pad voltage Vpad. The remaining offset is not a concern for applications that are based on a differential input.

Figure 12:
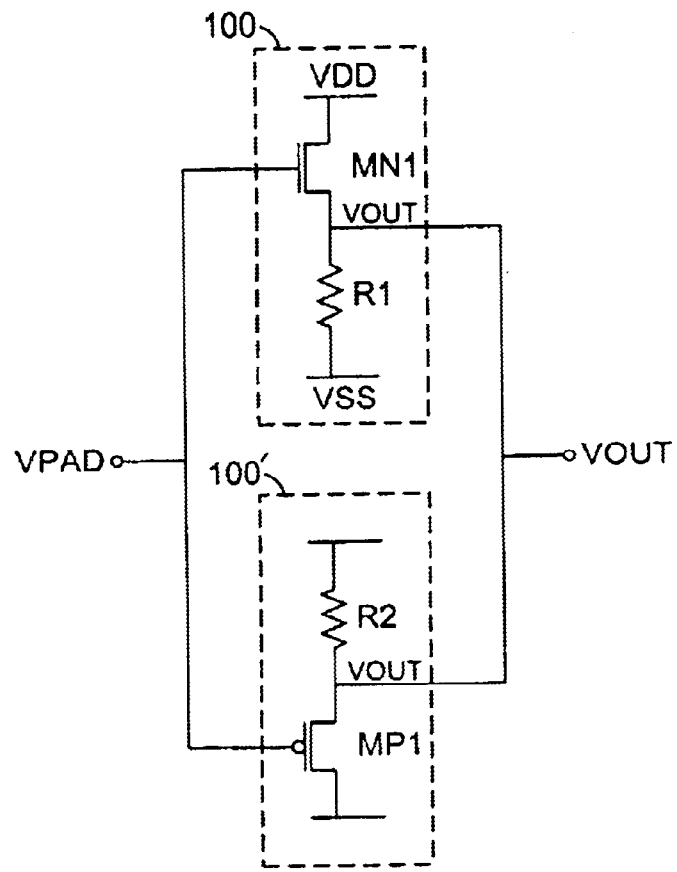
FIG. 12 is a diagram of another alternate embodiment of the present invention illustrating a parallel configuration.

A further advantage can be obtained by combining one NMOS-PMOS combination circuit described above in parallel with a PMOS-NMOS circuit. FIG. 12 illustrates such a configuration. By putting the PMOS first, 5V tolerance is more easily achieved in most processes because the NWELL of the PMOS device can be floated. In a triple well process either device may be placed first. The order may be determined by the designer based on the input range specification trying to be met.

Figure 13:
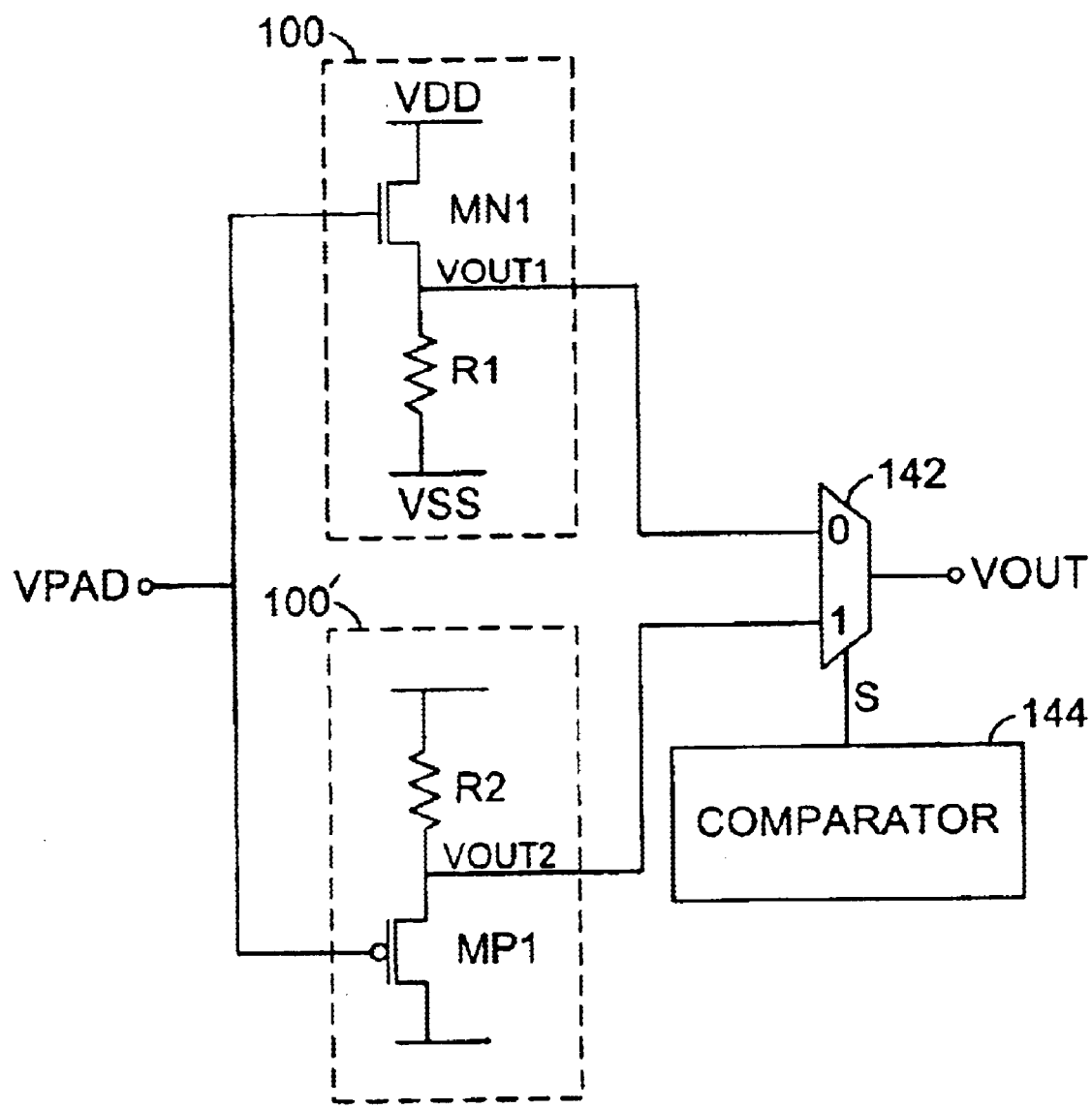
FIG. 13 is a diagram of another alternate embodiment of the present invention.

Furthermore, the output of each of the circuits 100 and 100' can be run through an analog multiplexer 142 that is controlled by a comparator 144. FIG. 13 illustrates such a configuration. Such a circuit will generally extend the output range of the source followers 100 and 100'.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals.

It will be apparent to those skilled in the relevant art(s) that certain nodes of transistors and other semiconductor devices may be interchanged and still achieve the desired electrical characteristics. The node interchanging may be achieved physically and/or electrically. Examples of transistor nodes that may be interchanged include, but are not limited to, the drain and source of field effect transistors.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first device comprising (i) a first gate configured to receive an input voltage ranging from up to twice a first supply voltage with respect to a second supply voltage to at least said second supply voltage, (ii) a first drain configured to receive said first supply voltage, and (iii) a first source coupled to a first output;

a first resistive element having (i) a first side coupled to said first source and (ii) a second side configured to receive said second supply voltage, wherein said apparatus is arranged such that a maximum voltage drop across a gate oxide of said first device does not exceed a difference between said first supply voltage and said second supply voltage and a voltage drop from said first gate to said first output is non-linear as a function of said input voltage; and a multiplexer configured to multiplex said first output and a second output to a third output.

2. The apparatus according to claim 1, wherein said first device is configured in a source-follow configuration.

3. The apparatus according to claim 1, wherein said first device comprises an NMOS device.

4. The apparatus according to claim 1, wherein said first device comprises a native NMOS device.

5. The apparatus according to claim 1, wherein said first device comprises a PMOS device.

6. The apparatus according to claim 1, wherein said first device comprises a native PMOS device.

7. The apparatus according to claim 1, wherein said first supply voltage comprises a ground voltage.

8. The apparatus according to claim 1, wherein said second supply voltage comprises a ground voltage.

9. The apparatus according to claim 1, further comprising a second device having (i) a second gate configured to receive said input voltage, (ii) a second drain configured to receive said second supply voltage, and (iii) a second source coupled to said second output.

10. The apparatus according to claim 9, further comprising a second resistive element having (i) a first side coupled to said second source and (ii) a second side configured to receive said first supply voltage.

11. A method for implementing voltage protection comprising the steps of:

configuring a first device to have (i) a first gate for receiving an input voltage ranging from up to twice a first supply voltage with respect to a second supply voltage to at least said second supply voltage, (ii) a first drain for receiving said first supply voltage, and (iii) a first source coupled to a first output;

configuring a first resistive element to have (i) a first side coupled to said first source and (ii) a second side for receiving said second supply voltage, wherein said first device and said first resistive element are arranged such that a maximum voltage drop across a gate oxide of said first device does not exceed a difference between said first supply voltage and said second supply voltage and a voltage drop from said first gate to said first output is non-linear as a function of said input voltage; and multiplexing said first output and a second output to a third output.

12. The method according to claim 11, wherein said first device is configured in a source-follow configuration.

13. The method according to claim 11, wherein said first device comprises an NMOS device.

14. The method according to claim 11, wherein said first device comprises a PMOS device.

15. The method according to claim 11, wherein said first device comprises a native NMOS device.

16. The method according to claim 11, wherein said first device comprises a native PMOS device.

17. The method according to claim 11, further comprising the step of:

configuring a second device to have (i) a second gate for receiving said input voltage, (ii) a second drain for receiving said second supply voltage, and (iii) a second source coupled to said second output.

18. The method according to claim 17, further comprising the step of:

configuring a second resistive element to have (i) a first side coupled to said second source and (ii) a second side for receiving said first supply voltage.

19. An apparatus comprising:

a first stage comprising (A) a first device comprising (i) a first gate configured to receive an input voltage ranging from greater than a first supply voltage to at least a second supply voltage, (ii) a first drain configured to receive said first supply voltage, and (iii) a first source directly connected to an output, and (B) a first resistive element having (i) a first side coupled to said first source and (ii) a second side configured to receive said second supply voltage; and a second stage comprising (A) a second device comprising (i) a second gate configured to receive said input voltage, (ii) a second drain configured to receive said second supply voltage, and (iii) a second source directly connected to said output, and (B) a second resistive element having a first side coupled to said second source and a second side configured to receive said first supply voltage, wherein said apparatus is arranged such that a maximum voltage drop across each gate oxide of said first device and said second device does not exceed a difference between said first supply voltage and said second supply voltage.

* * * * *